US006819147B2

United States Patent
Paulus

(10) Patent No.: US 6,819,147 B2
(45) Date of Patent: Nov. 16, 2004

(54) CURRENT SAMPLE-AND-HOLD-CIRCUIT, A/D CONVERTER AND A METHOD FOR OPERATING A CURRENT SAMPLE-AND-HOLD CIRCUIT

(75) Inventor: Christian Paulus, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/297,496
(22) PCT Filed: Aug. 3, 2001
(86) PCT No.: PCT/DE01/02969
§ 371 (c)(1),
(2), (4) Date: Apr. 7, 2003
(87) PCT Pub. No.: WO02/13200
PCT Pub. Date: Feb. 14, 2002

(65) Prior Publication Data
US 2003/0179019 A1 Sep. 25, 2003

(30) Foreign Application Priority Data
Aug. 4, 2000 (DE) ........................ 100 38 231

(51) Int. Cl.⁷ .............................. G11C 27/02
(52) U.S. Cl. ........................... 327/94; 327/91

(58) Field of Search .................. 327/91, 94, 95, 327/96, 337, 554; 341/122, 124, 172; 330/9

(56) References Cited

U.S. PATENT DOCUMENTS

| 4,199,697 | A | * | 4/1980 | Edwards | 332/115 |
| 5,179,301 | A | * | 1/1993 | Hughes | 327/335 |
| 5,227,676 | A | * | 7/1993 | Bahr et al. | 327/94 |
| 6,549,043 | B2 | * | 4/2003 | Roovers | 327/94 |

* cited by examiner

Primary Examiner—Timothy P. Callahan
Assistant Examiner—An T. Luu
(74) Attorney, Agent, or Firm—Altera Law Group, LLC; Jeffrey R. Stone

(57) ABSTRACT

The invention relates to a current sample-and-hold circuit comprising several sub-circuits, in which a current signal is stored. At least one of said sub-circuits contains a switch. The inventive current hold-and-sample circuit is characterized in that each of the sub-circuits contains a linear resistor, which is connected in such a way that the current signal generates a voltage drop across the resistor, that each of the sub-circuits contains at least one inverting control amplifier, which sets an initial current of the circuit in a hold operational mode, thus inducing a voltage drop across the resistor, said voltage drop being substantially as great as the voltage drop across the resistor before the hold operational mode.

5 Claims, 2 Drawing Sheets

CURRENT SAMPLE-AND-HOLD-CIRCUIT, A/D CONVERTER AND A METHOD FOR OPERATING A CURRENT SAMPLE-AND-HOLD CIRCUIT

The invention relates to a current sample-and-hold circuit having a plurality of subcircuits which store a current signal, at least one of the subcircuits containing a switch which is at a constant potential.

The invention also relates to an analog/digital converter having at least one current sample-and-hold circuit.

The invention also relates to a method for operating a current sample-and-hold circuit.

The accuracy of analog/digital converters depends, inter alia, on the sample-and-hold circuits used (Sample & Hold Circuits), which provide an analog input signal at discrete times for subsequent quantization.

Particularly in the case of sample & hold circuits using CMOS technology, whose information transfer is effected in the voltage domain, the relevant switching elements are known to need to be at a virtual ground potential at any turn-off time (zero-switching technique) in order to attain a high level of accuracy. The turn-off pulse thus always injects the same fault charge into the sampling capacitance, which avoids sampling errors dependent on the input signal and results in a high level of sampling accuracy.

If currents are used for information transfer instead of voltages (current mode), then the current is usually attributed to a voltage which can be stored in a capacitor. Since the switching transistor's channel is at a potential which is dependent on the input signal in most architectures, the fault charge injected during the turn-off operation distorts the sampling result. By using an operational amplifier, a zero-switching technique can also be implemented in this case, but this has negative effects on the bandwidth of the circuit.

A generic current sample-and-hold circuit is known from the article by Jonsson and S. Eriksson: "New Clock-Feedthrough Compensation Scheme for Switched-Current Circuits", Electr. Lett., Vol. 29, No. 16, pp. 1446–1447, August 1993. This circuit requires four subcircuits for storing the signal.

Another generic current sample-and-hold circuit is known from the book by B. Jonsson et al., Switched-Current Circuits: From Building Blocks to Mixed Analog-Digital Systems, Stockholm 1999, pp. 27–33.

The use of switching elements, for example n-MOS transistors, which are at the same virtual ground potential at any time is referred to as a zero-switching technique. In contrast to the use of transmission gates, consisting of n-MOS and p-MOS transistors, the hold time can be determined very exactly in this case, since a single signal is used to turn off all the switches simultaneously, especially since all the switching transistors are always at the same constant potential. Particularly in the case of fast analog/digital converters (ADCs), such as are used, by way of example, to process video signals or other radio-frequency signals, the jitter, that is to say the discrepancies in the turn-off time, otherwise significantly determines the accuracy of the sampling element. In addition, the turn-off pulse always injects the same fault charge into the sampling capacitance when the switch potential is constant, which avoids sampling errors which are dependent on the input signal. The invention comprises a simple method for discrete-time current signal sampling, where the relevant switching elements are always at a virtual ground potential, and this results in the aforementioned advantages (low jitter, constant charge-injection). Its low complexity means that it is particularly suitable for high signal bandwidths.

To reduce the signal-dependent sampling errors which cannot be eliminated by virtue of a fully differential design, various measures are taken which are known by the terms n-step principle, zero-switching technique and replica technique.

In addition, U.S. Pat. No. 5,227,676 describes a current sample-and-hold circuit having a subcircuit which is used for storing the current. The known current sample-and-hold circuit also contains linear resistors, which are actually arranged outside the subcircuit. A similar situation applies to the current sample-and-hold circuit described in (B. Razavi, A 200-MHz 15-mW BiCMOS Sample-and-Hold Amplifier with 3 V Supply, IEEE Journal of Solid State Circuits, Vol. 30, No. 12, pp. 1326–1332, December 1995).

The invention is based on the object of providing a current sample-and-hold circuit in which signal-dependent sampling errors are eliminated as far as possible.

The invention achieves this object by virtue of a generic current sample-and-hold circuit being designed such that the subcircuits each contain at least one linear resistor which is connected such that the current signal produces a voltage drop across a resistor, and such that the subcircuits each contain at least one control amplifier which is operated so as to cause inversion and, in a hold mode, sets an output current for the circuit which causes a voltage drop across the resistor which is essentially the same size as the voltage drop across the resistor before the hold mode.

A simple structure to the circuit and a simple clock sequence for the signals means that only a few turn-off pulses, preferably only a single turn-off pulse, are required. Consequently, the current sample-and-hold circuit is also particularly suitable for radio-frequency applications, for example for processing video signals.

Preferably, the invention includes a fully differential design for the circuit. A differential design allows errors to be suppressed.

The invention also relates to performance of a method for operating a current sample-and-hold circuit having a plurality of subcircuits, the subcircuits each storing a current signal, such that the current signal produces a voltage drop across a resistor, and such that a control amplifier which the subcircuits contain and which is operated so as to cause inversion sets, in a hold mode, an output current for the circuit which causes a voltage drop across the resistor which is essentially the same size as the voltage drop across the resistor before the hold mode.

One preferred embodiment of the current sample-and-hold circuit and of the method for operating is distinguished in that at least two subcircuits can be connected to one another using a connecting switch.

In this context, it is particularly expedient that the connecting switch is arranged such that, in a turned-on state of the connecting switch, a charging current for storage capacitors is produced solely by the current signal.

It is also advantageous to design the current sample-and-hold circuit such, or to perform the method for operating the current sample-and-hold circuit such, that all the subcircuits contain switches which are each at the same potential.

Other advantages, peculiarities and expedient developments of the invention can be found in the subclaims and in the description below of preferred exemplary embodiments with reference to the drawings, in which:

FIG. 1 shows a basic illustration of a sample-and-hold circuit for voltage signals with switches $S_{1a}$ and $S_{1b}$. The switches $S_{1a}$ and $S_{1b}$, which determine the accuracy, are at a constant potential and therefore inject the same fault charge independently of signal.

Figure 1:
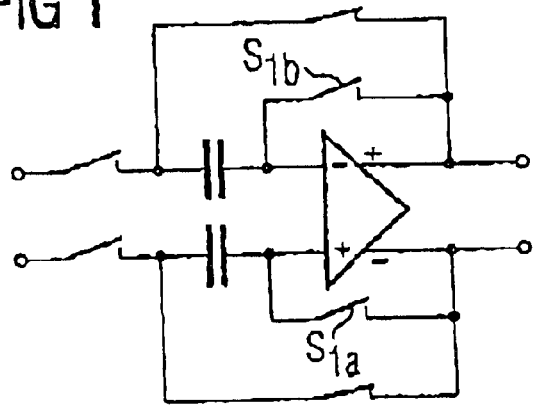
FIG. 1 shows a basic circuit diagram of a sample-and-hold circuit for voltage signals.
Figure 2:
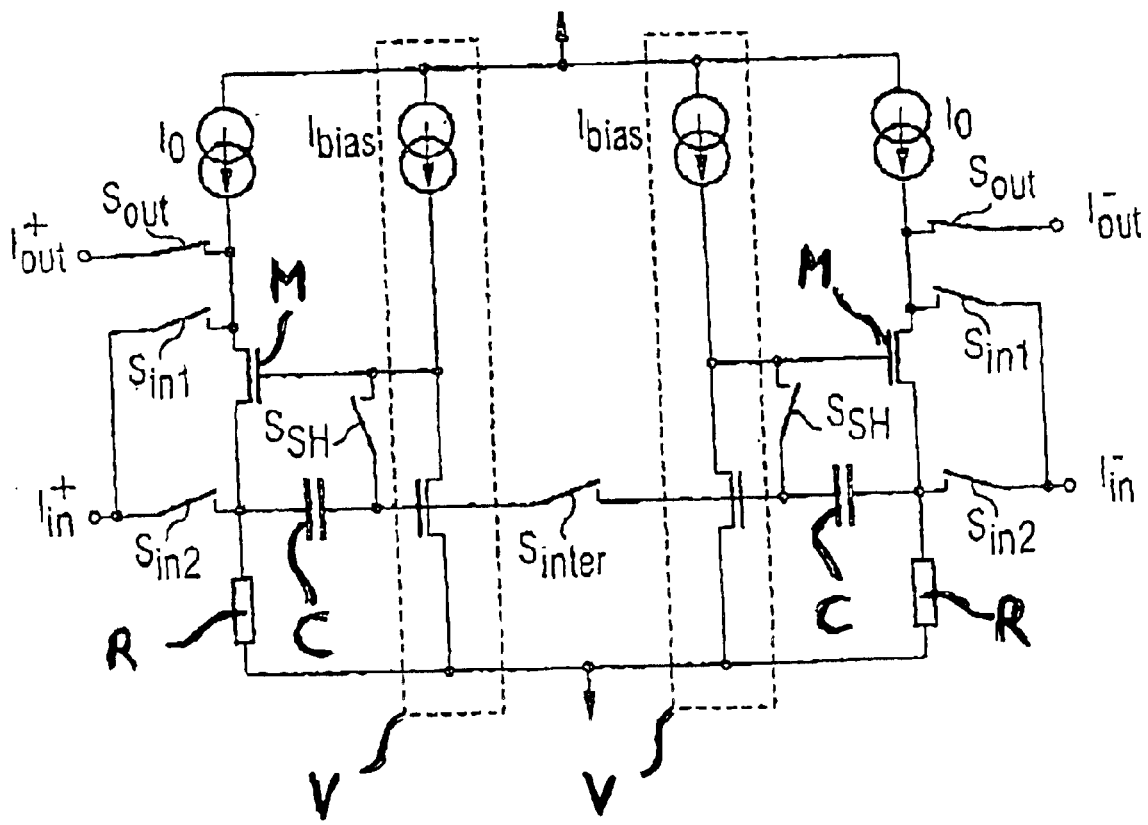
FIG. 2 shows a basic circuit diagram of a fully differential sample-and-hold circuit in accordance with the invention.
Figure 3:
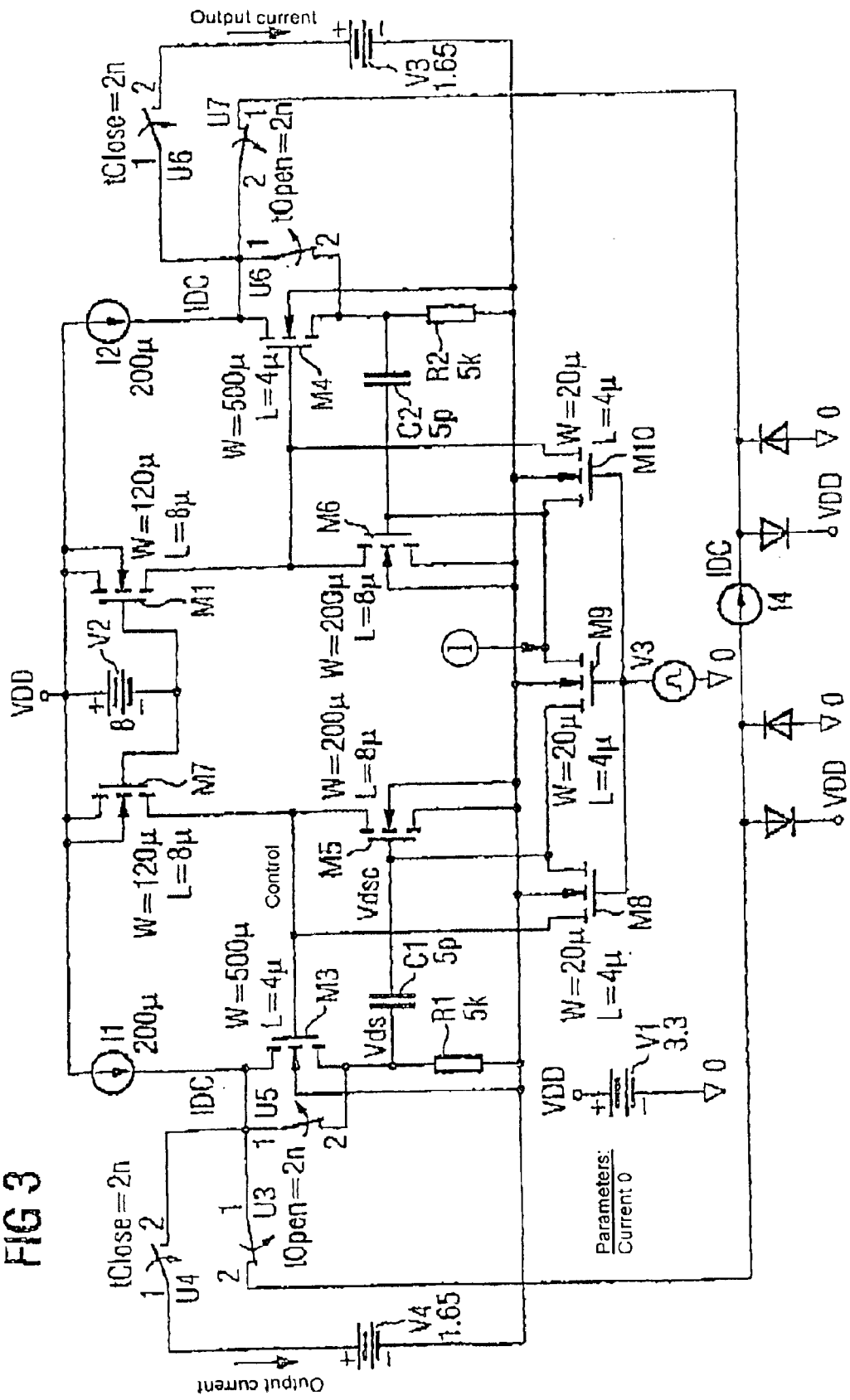
FIG. 3 shows a detailed illustration of a preferred circuit in accordance with the invention.

A particularly expedient embodiment of the invention is implemented by a current sample-and-hold circuit in which the switching elements are always at the same potential. Such a current sample-and-hold circuit is shown by way of example in FIG. 2. An input current is linearly converted into a voltage in a resistor R. One connection of a switching transistor $S_{SH}$ is connected to a capacitor C. When this switching transistor is off, the storage capacitor C, the amplifier V and the transistor M form a control loop which keeps the potential on the resistor constant. In this form, the circuit represents a current source with a high output impedance which holds the sampled current.

Before holding, the charging current for the capacitor C needs to be supplied by the shorted inverting amplifier V, which can require high currents. With a fully differential design for the sampling element, this displacement current is supplied via the switch $S_{inter}$ in the second path, so that the output current demands on the inverting amplifiers are low.

The amplifier V can be produced, by way of example, by a simple cascode circuit, as a result of which the overall circuit permits very high band widths.

An important advantage of the invention is that a current sample-and-hold element is produced in which the relevant switching elements are at a fixed potential, without needing to use complicated (=bandwidth-limiting) operational amplifier structures. The fully differential design allows the demands on the amplifier circuit V to be kept down.

Before the hold time, the differential input current is discharged to ground via the resistors, which results in a voltage across the resistor which is proportional to the current. This voltage is on one plate of the capacitors C, whose other connection is at a virtual ground potential stipulated by the inverting control amplifiers (dashed boxes) shorted by $S_{SH}$.

At the hold time, the switches $S_{SH}$ and $S_{inter}$ are turned off simultaneously and the input switches are then switched over. The inverting control amplifier now has the task of producing an output current which results in a voltage drop across the resistor at the original level. To achieve the required output impedance of the current source, the control loop, consisting of the storage capacitor C, the inverting amplifier and the control transistor above the resistor, needs to have sufficient gain.

In the fully differential embodiment of the circuit, the switch $S_{inter}$ is used to derive the charging current for the storage capacitors solely from the signal current. This reduces the demands on the inverting control amplifiers, which would otherwise need to discharge the charging current for the storage capacitors.

The resistors can also have a nonlinear characteristic curve, for example when in the form of MOS transistors in the triode domain. As a result, the capacitance charging currents in the two signal paths no longer compensate for one another exactly, which means that the differential current needs to be supplied by the shorted control amplifiers.

An advantage of this solution is that the relevant switching elements always have the same, constant potential at the turn-off time. This significantly reduces sampling errors resulting from jitter and charge-injection.

The simple structure and the simple clock sequence (a single turn-off pulse) for the circuit makes it particularly suitable for broadband applications, with the implemented zero-switching technique simultaneously allowing a high degree of linearity.

List of Reference Symbols

C Capacitor
M Transistor
Q Fault charge amount
R Resistor
S Switch
$S_{1a}$ Switch
$S_{1b}$ Switch
$S_{inter}$ Switch
$S_{SH}$ Switching transistor
V Amplifier

What is claimed is:

1. A current sample-and-hold circuit having a plurality of subcircuits which store a current signal, at least one of the subcircuits containing a switch, characterized in that the subcircuits each contain at least one linear resistor which is connected such that the current signal produces a voltage drop across the one linear resistor, and in that the subcircuits each contain at least one inverting control amplifier which in a hold mode, sets an output current for the current sample-and-hold circuit which causes a voltage drop across the one linear resistor which is essentially the same size as a voltage drop across the one linear resistor before the hold mode.

2. The current sample-and-hold circuit as claimed in claim 1, characterized in that at least two subcircuits can be connected to one another using a connecting switch ($S_{inter}$).

3. The current sample-and-hold circuit as claimed in claim 2, characterized in that the connecting switch ($S_{inter}$) is arranged such that, in a turned-on state of the connecting switch, a charging current for storage capacitors is produced solely by the current signal.

4. The current sample-and-hold circuit as claimed in claim 1, characterized in that all the subcircuits contain switches which are each at the same potential.

5. A method for operating a current sample-and-hold circuit having a plurality of subcircuits, the subcircuits each storing a current signal, characterized in that the current signal produces a voltage drop across a resistor, and in that an inverting control amplifier which the subcircuits contain sets, in a hold mode, an output current for the current sample-and-hold circuit which causes a voltage drop across the resistor which is essentially the same size as a voltage drop across the resistor before the hold mode.

* * * * *